(12) United States Patent
Yifrach et al.

(10) Patent No.: US 7,904,865 B2
(45) Date of Patent: Mar. 8, 2011

(54) PLACEMENT DRIVEN ROUTING

(75) Inventors: Shaul Yifrach, Haifa (IL); Michael Bar-Joshua, Haifa (IL); Itamar Tsachi, Modiin (IL); Boaz Yeger, Ya'akov (IL)

(73) Assignee: International Business Machines Corporation, Armonk, NY (US)

( * ) Notice: Subject to any disclaimer, the term of this patent is extended or adjusted under 35 U.S.C. 154(b) by 629 days.

(21) Appl. No.: 12/018,422

(22) Filed: Jan. 23, 2008

(65) Prior Publication Data

US 2009/0187870 A1 Jul. 23, 2009

(51) Int. Cl.
*G06F 17/50* (2006.01)

(52) U.S. Cl. .......... 716/126; 716/120; 716/123; 716/132

(58) Field of Classification Search .................. None
See application file for complete search history.

(56) References Cited

U.S. PATENT DOCUMENTS

| | | | |
|---|---|---|---|
| 5,847,968 A * | 12/1998 | Miura et al. ................ 716/8 |
| 6,249,902 B1 | 6/2001 | Igusa et al. |
| 6,728,944 B2 | 4/2004 | Clabes et al. |
| 7,065,729 B1 * | 6/2006 | Chapman ................ 716/13 |
| 7,275,230 B2 * | 9/2007 | Gentry et al. ............. 716/13 |
| 7,490,310 B2 * | 2/2009 | Koehl et al. .............. 716/11 |
| 2007/0089079 A1 | 4/2007 | Koehl et al. |

* cited by examiner

*Primary Examiner* — Leigh Marie Garbowski
(74) *Attorney, Agent, or Firm* — Gibb I.P. Law Firm, LLC

(57) ABSTRACT

A method placing items routing wiring pursuant to integrated circuit specifications to create an integrated circuit design. Once the initially placed design is legalized, rather that just starting wiring routing, the method identifies books in the integrated circuit design which contain blocked items. The method allows the routing process to be paused temporarily, and for the items to be moved to a certain extent. This movement process is controlled (limited according to signal power output by the associated books) so that the timing of the integrated circuit design is not affected by any such "mid-routing" movement. If the books do not have any blocked items, the process continues to route wires between the items and the books. If at any point before or during the routing of the wires it is found that the books do have blocked items, the process pauses the routing of the wires and performs any number of different processes to solve the blocked item situation (unblock the blocked items).

6 Claims, 2 Drawing Sheets

PLACEMENT DRIVEN ROUTING

BACKGROUND

1. Field of the Invention

Embodiments herein generally relate to placing items and routing wiring pursuant to integrated circuit specifications to create an integrated circuit design in a process that pauses the wiring routing process to allow repositioning of previously placed items to make the wiring routing process more productive.

2. Description of Related Art

As described in U.S. Patent Publication 2007/0089079 (the complete disclosure of which is incorporated herein by reference), the blocks and sub-blocks that form an IC or a board can be divided into different hierarchy levels: the device level comprising elements such as transistors, diodes, and capacitors, the book level comprising elements from a library such as gates (i.e. NAND and NOR circuits) and latches, the macro level comprising complex elements like adders and dividers, the unit level comprising elements from the macro level (i.e. adder) and the chip level comprising elements from the macro and the unit level (i.e. Floating Point Unit), and the board level comprising elements such as integrated circuits.

Both placement and routing are usually performed sequentially. In an iteration step the layout is optimized for various goals while ensuring signal integrity and compliance to various design rules related to the semiconductor manufacturing process. Examples of placement optimization goals are minimizing the wire-length between the various blocks as the signal delay increases with the wire length, and maximizing the wire density to save chip area. Examples of routing optimization goals are minimizing the wire length, and having the same or similar length for certain wires. If it is not possible to achieve the optimization goals then the current layout is dropped, the design of the IC will be changed and the placement and routing process is started again. With the enduring trend of devices (e.g. transistors) and books and macros (e.g. gates) becoming smaller and faster, IC designs are being limited by the delays of the wires connecting the devices and macros rather than by their area.

As technology moves to advanced processes, routing becomes more dominant in the physical design process. The general concept of good placement will yield "good routing" might not hold in advanced technologies. Since power, noise, and timing are more difficult to solve, and routing has a bigger impact on these violations.

SUMMARY

The embodiments of the invention generally relate the ability to close routing with minimum impact on design (timing, congestion, TAT, etc.). The invention can resolve routing problems by placement modification and optimization. The invention uses existing techniques (i.e., placement legalization) and new ones, such as book spreading. The invention minimizes the amount of changes that yield a good solution to spread books according to routing, power and noise, in any stage (routing or placement). The invention resolves routing, power, and noise issues by placement modification and optimization.

Thus, this disclosure presents methods of placing items and routing wiring pursuant to integrated circuit specifications to create an integrated circuit design. In one embodiment, the method places and positions the items to create the initial, unwired integrated circuit design. The integrated circuit design comprises generic books, wherein the books comprise a group of items previously positioned within a book area. The "books" are referred to as such because they are stored in integrated circuit design "libraries". The books are generic to, and can be used in a plurality of different integrated circuit designs.

After placing the items within the circuit design, the method "legalizes" placement of the items within the integrated circuit design by checking the position of the items against rules and moving items that violate the rules. Once the initially placed design is legalized, rather that just starting wiring routing, the method identifies books in the integrated circuit design which contain blocked items.

Such "blocked" items are items that have pins blocked by prewired nets, such as power nets, clocknets, etc. wires. Sometimes these wires can be moved by the wiring router to unblock such items; however, many times such wires are immovable, and the items will be blocked and considered "un-routable" (incapable of having wires run to or from the item).

Rather than simply reporting such items as un-routable errors, the embodiments herein allow the routing process to be paused temporarily, and for the items to be moved to a limited extent. This movement process is controlled (limited according to signal power output by the associated books) so that the timing of the integrated circuit design is not affected by any such "mid-routing" movement.

More specifically, if the books do not have any blocked items, the process continues to route wires between the items and the books. The method periodically checks whether this routing of the wires creates additional blocked items. If at any point before or during the routing of the wires it is found that the books do have blocked items, the process pauses the routing of the wires and performs any number of different processes to solve the blocked item situation (unblock the blocked items).

For example, while the routing process is paused, the method can reposition books that have the blocked items in a controlled process that limits movement of the books according to the signal output power of the books (even though the power level of the book is not changed). After repositioning any books, the method reports any errors, checks for more blocked pins, and checks routing utilization of the wires. While the books are repositioned, N-wells can be removed (and later replaced) to make any repositioning easier. The method can also spread out the books that have the blocked items (book spreading) by increasing the book area to a larger book area and spreading out the items within the larger book area. The increase in book area size is also limited according to the signal output power of the books.

The manner of limiting the increase in book size and limiting the amount that books may be moved prevents the timing of the circuit from being changed significantly. While any item movement may change signal timing within a given circuit, this process looks to the book's power (signal output power) to make sure that any changes to the signal timing within the circuit are insignificant (within acceptable tolerances), so that the existing timing characteristics of the design will not change. If a book has greater signal output power, it can be moved further because the greater signal strength will accommodate for the books movement or expansion. Therefore, the embodiments herein limit those books with lower signal power to smaller movements and smaller book area expansions, when compared to books having higher signal power.

After the items are moved and/or the books are spread out, the method iteratively repeats the legalizing of the placement, the identifying of the books that contain blocked items, the routing of the wires, the pausing of the routing, the repositioning of the books, and the spreading out of the books, until the routing of the wires is complete. Once the routing is complete, various conventional processes are performed (adding buffers, rerouting open nets, adding N-well books, adding redundant vias, etc.) to produce a finalized integrated circuit design, and the same is output.

The embodiments herein achieve smarter routing because they correct placement before routing and during routing. Techniques such as legalizing placement, spreading, adding and moving cells according to wire length and cell specifications, and fixing and reporting scenic nets and long wires are performed. This is an iterative procedure that will finally close down to the best routing driven placement results.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
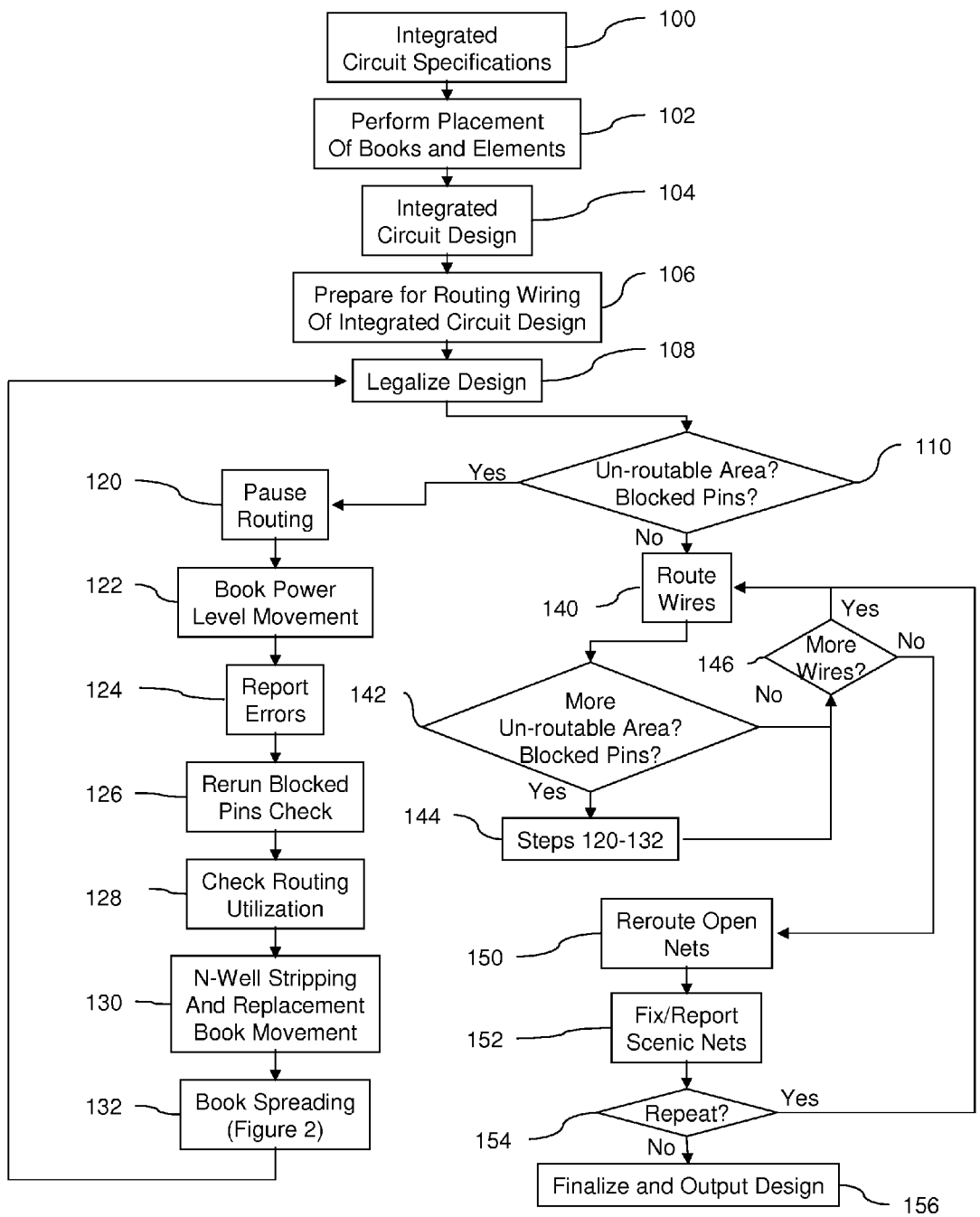
FIG. 1 is a flow diagram illustrating a method embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Thus, this disclosure presents methods of placing items and routing wiring pursuant to integrated circuit specifications to create an integrated circuit design The invention has the ability to close routing with minimum impact on design (timing, congestion, TAT, etc.). The invention can resolve routing problems by placement modification and optimization. The invention can use placement legalization, book spreading, etc., and minimizes the amount of changes that yield a good solution. The invention has ability to spread books according to routing, power and noise, in any stage (routing/placement).

In the process flow, the method can set variables, legalize, and check and fix pins blocked by must keep (MU) wires. The method can search for crowded areas that cannot be routed and can strip and add N-well books in crowded areas. The method can also spread out congested areas that may be impossible to route. The processes herein allow movement of fixed cells within the confined area. The embodiments herein can also add N-buffers on long wires, fix and report scenic nets, show long wires and close wires, add redundant vias, etc.

More specifically, as shown in flowchart form in FIG. 1, the embodiments herein begin with integrated circuit specifications 100 with which the final integrated circuit design must comply. A common placement engine is utilized to place and position the items 102 to create the initial, unwired integrated circuit design 104. Many details regarding placement and position of items within integrated circuit designs is discussed in U.S. Pat. No. 6,249,902, the complete disclosure of which is incorporated herein by reference, and such details are not enumerated here.

The integrated circuit design 104 comprises generic books, wherein the books comprise a group of items previously positioned within a book area. The "books" are referred to as such because they are stored in integrated circuit design "libraries". The books and are generic to a plurality of different integrated circuit designs.

As explained in U.S. Pat. No. 6,728,944, the complete disclosure of which is incorporated herein by reference, a "book" or "logic block" refers to an identifiable primitive function (i.e., "cell"). This includes a pre-designed circuit for performing a certain Boolean function, together with certain information about the circuit. There are libraries of these books for use in building circuits. The library includes different sizes and different strengths for a particular type of book or logic block. For example, the library could include several different physical sizes for a particular type of local clock buffer as well as several different physical sizes for a particular type of latch.

After positioning the books and items within the circuit design 104, the method prepares for the process of routing wiring for the integrated circuit design 106. Before actually routing any wires, the first step in the routing process "legalizes" placement of the items 108 within the integrated circuit design by checking the position of the items against rules and moving items that violate the rules. Once the initially placed design is legalized, rather that just starting wiring routing, the method performs a pre-routing process that identifies books in the integrated circuit design which contain blocked items that may contain an un-routable area or block pins, as shown by a decision box 110.

Such "blocked" items are items that have pins blocked by prewired nets, such as power nets, clocknets, etc. Sometimes these wires can be moved by the wiring router to unblock such items; however, many times such wires are unmovable (MU), and the items will be blocked and considered "un-routable" (incapable of having wires run to or from the item).

Rather than simply reporting such items as un-routable errors, the embodiments herein allow the routing process to be paused temporarily (item 120); and allow for the items to be moved a limited extent. This movement process is controlled (limited according to signal power output by the associated books) so that the timing of the integrated circuit design is not affected by any such "pre-routing" movement.

If it is found that the books do have blocked items, the process pauses the routing of the wires in item 120 and performs any number of different processes (items 122, 130, 132, etc.) to solve the blocked item situation (unblock the blocked items).

For example, while the routing process is paused, the method can reposition books (item 122) that have the blocked items in a controlled process referred to as Book Power Level Movement (BPLM) that limits movement of the books according to the signal output power of the books. This does not change the power of the books, but just determines the number of tracks to move the books.

After repositioning any books, the method reports any errors in item 124, checks for more blocked pins in item 126, and checks routing utilization of the wires in item 128. While the books are repositioned, N-wells can be removed (and later replaced) to make any repositioning easier as shown by item 130.

Figure 2:
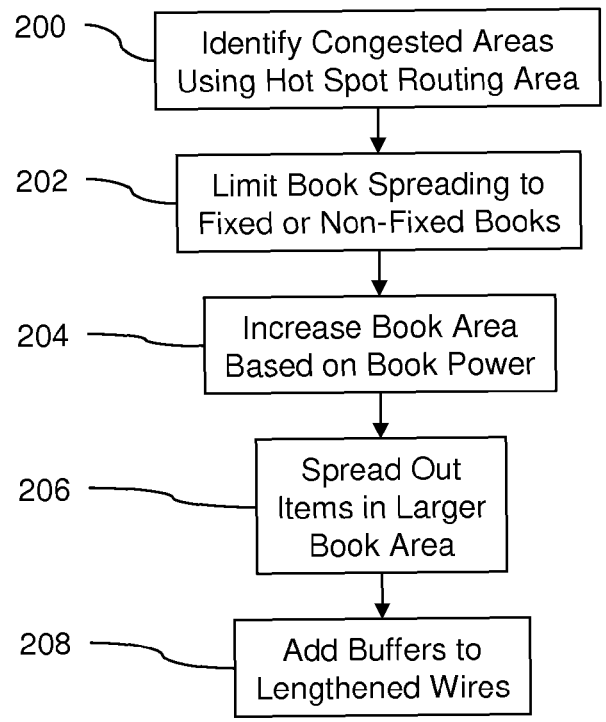
FIG. 2 is a flow diagram illustrating a method embodiment of the invention.

The method can also spread out the books that have the blocked items (book spreading) as indicated by item 132. The details of book spreading are illustrated in the flowchart of FIG. 2. More specifically, congested and uncongested areas are identified using some congestion standard. For example, the embodiments herein can utilize a Hot Spot Routing Area (HSRA) process (item 200) that looks at the percentage of free space available in a specific location to determine how congested an area is. This allows relatively more congested and relatively less congested areas to be identified, with the ultimate goal of moving items from more congested areas to less congested areas.

The book spreading process can be limited to only non-fixed books. Alternatively, fixed books (those books which a library mandates shall not be changed in size) may also be spread by embodiments herein. Whether fixed books will be spread out depends upon various configuration settings that can be established prior to the routing process of the present embodiments. Thus, movement of fixed cells can be allowed if certain preconditions are met. For example, movement of fixed cells will be allowed if the book height is less than 2 rows and the required displacement is less than a predefined value. This is illustrated as item 202 in the flowchart of FIG. 2.

Figure 3:
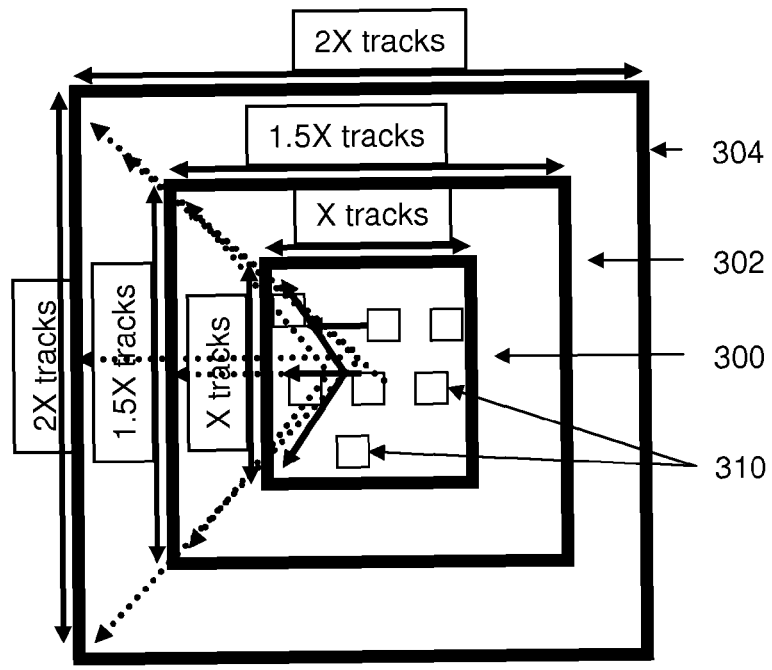
FIG. 3 is a schematic diagram illustrating book spreading according to an embodiment of the invention.

Item 204 illustrates that this process continues by increasing the book area. This is shown in FIG. 3 where an original book area 300 containing various items 310 can be increased in size to a larger book area 302, or to an even greater larger book area 304. Many books are measured in units referred to as "tracks" and the size references shown in FIG. 3 show relative 1.5× and 2.5× increases in track size over the originally sized book. The embodiments herein iteratively search for free space to which the cell can be moved using a growing radius to achieve a minimal displacement.

In item 206, the items 310 within the book 300 will be spread out preferably in a direction away from a congested area and toward an uncongested area. Thus, the process increases the book area to a larger book area and spreads out the items within the larger book area, which causes the wires within the book to be lengthened. In order to compensate for these lengthened wires, item 208 adds buffers to the lengthens wires of scenic nets.

The increase in book area size is also limited according to the signal output power of the books. This manner of limiting the increase in book size and limiting the amount that books may be moved prevents the timing of the circuit from being changed significantly. While any item's movement may change signal timing within a given circuit, this process looks to the book's power (signal output power) to make sure that any changes to the signal timing within the circuit are insignificant (within acceptable tolerances). If a book has greater signal output power, it can be moved further because the greater signal strength will accommodate for the books movement or expansion. Therefore, the embodiments herein limit those books with lower signal power to smaller movements and smaller book area expansions, when compared to books having higher signal power.

Thus a higher power book will be able to be increased in size a greater relative amount than a lower power book, without altering (by any significant amount) the timing of the integrated circuit design. Once again, a higher power book can be expanded further without causing significant output signal change. This allows the embodiments herein to make slight positional movements of the elements within the integrated circuit design, without substantially altering the timing of the integrated circuit design. This ability to slightly move some elements during routing (after placement has been completed) allows the wiring routing process to be more efficiently performed.

Thus, after identifying un-routable nets pins, the process pauses the routing engine and invokes the placement procedure only on the identified books (the books having cells with un-routable net pins). The method creates a window containing a valid placement area to replace or expand the book. The method enlarges the searching window of the legal placement area according to book size (starting with, for example, a 2X and 2Y window). This process is continued iteratively until a maximum window size based on the book power level. (For example, BPLM could be 50 tracks×50 tracks on a C book power level).

The maximum amount by which cells are moved is, therefore, based on the power level of the corresponding blocked book being spread out. For example, cells can be moved according to the cell power level BHC=C 50 tracks; BHC=E 100 tracks; BHC=H 200 tracks; BHC=L 400 tracks; BHC=O 800 tracks, etc. (where BHC refers to cell power level and C, E, H, etc. refer to the specific cell power level). This allows the items (cells) to be moved from their original locations in the original book area to less congested areas in the larger book area. Embodiments herein move cells one by one towards the free area so that every cell is moved a minimal distance (few tracks).

After the items are moved and/or the books are spread out, the process is ready to start (or continue) routing wires. As shown by the arrow from item 132 to item 108, the method iteratively repeats the legalizing of the placement 108, the identifying of the books that contain blocked items 110, the pausing of the routing 120, the repositioning of the books 122-130, and the spreading out of the books 132.

If the books do not have any blocked items in item 110, the process proceeds to item 140 to actually route wires between the items and the books. The method periodically checks whether this routing of the wires creates additional blocked items as shown by decision box 142. Thus, during the actual wire routing process, so long as the addition of wires in the wire routing process of item 140 does not create additional un-routable areas or blocked bins, the routing process continues (as shown by item 140).

However, if these additional wires added in item 140 create un-routable areas, the processing shown in items 120-132 is performed to make minor movements of items while the wire routing process is paused (as shown by item 144). Thus, in item 144, the routing is paused, items and books are moved and/or spread out, checks are made, error reports are generated, etc. as shown in items 120-132.

After the processing in item 144 is completed (or if decision block 142 concludes that no items are blocked) decision box 146 evaluates whether more wires need to be routed. If so, processing proceeds to item 140 to route more wire. If not, the processing flow proceeds to item 150, where any open nets can be rerouted and to item 152 where scenic nets can be reported or fixed.

The running process is iteratively repeated (item 154) a specific number of times or until some goal is achieved (some utilization measure is met) indicating that the routing of the wires is complete. Once the routing is complete, various conventional processes are performed (adding buffers, adding N-well books, adding redundant vias, etc.) to produce a finalized integrated circuit design, and the same is output (this shown by item 156).

This procedure is advantageous because it adds pre-routing, cleaning, placement check, and fixing capabilities to the router (according to BPLM (Book Power Level Movement)). This procedure is run inside the router, so when the router is invoked, the procedure runs also. This saves runtime of loading the design database (DB) to the router: if the DB is not valid, the router will not crash after X runtime, but will fix some errors as it runs. The increase of the book area is advantageous in the ability to run the placement on a single book. This allows the run time to be short, the code to be light, and the procedure can be assimilated inside a router with a minimal burden on the router code.

Thus, the embodiments herein route a few iterations and then identify un-routable nets. There is not a utilization error with embodiments herein (because this was solved earlier in item 128) and moving a particular book generally solves any such issues. The process move books with un-routable nets according to the BPLM procedure described above (minimum movement not more then BPLM). Then only open nets are rerouted and scenic nets are fixed or reported.

The embodiments herein achieve smarter routing because these embodiments correct placement before routing and during routing. Techniques such as legalizing placement, spreading, adding and moving cells according to wire length and cell specifications, and fixing or reporting scenic nets and long wires are performed. This is an iterative procedure that will finally close down to the best routing driven placement results.

The embodiments of the invention close routing with minimum impact on design (timing, congestion, TAT, etc.). The invention can resolve routing problems by placement modification and optimization and uses existing techniques (i.e., placement legalization) and new ones such as book spreading. The invention minimizes the amount of changes that yield a good solution to spread books according to routing, power and noise, in any stage (routing/placement). The invention resolves routing, power and noise issues by placement modification and optimization.

One of the strengths of embodiments herein is that the movement and expansion of the books is very slight (not robust). The movement processes provided herein are intended to perform only the minimum amount of movement needed to free up blocked pins, and no more. Thus, the movements performed with embodiments are below the threshold of being considered "significant" relative to the design in question, and therefore do not affect the design. Further, the embodiments herein are part of the router (not part of the layout or placement engine). Thus, embodiments herein give the router the ability to move books, which dramatically improves the effectiveness of the router. By allowing the router to move books, the router has another option to solve the problem of un-routable books that was not available previously.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. A method of placing items and routing wiring pursuant to integrated circuit specifications, said method comprising:
    placing and positioning said items to create an integrated circuit design, wherein said integrated circuit design comprises books, wherein said books comprise a group of items previously positioned within a book area, and wherein said books are stored in integrated circuit design libraries and are generic to a plurality of different integrated circuit designs;
    legalizing placement of said items within said integrated circuit design by checking positions of said items against rules and moving items that violate said rules;
    identifying ones of said books in said integrated circuit design which contain blocked items that have pins blocked by wires;
    if said books do not have said blocked items, routing wires between said items and said books and periodically checking whether said routing of said wires creates additional blocked items;
    if said books do have said blocked items:
        pausing said routing of said wires; and
        repositioning ones of said books that have said blocked items in a controlled process that limits movement of said books according to a signal output power of said books;
    iteratively repeating said legalizing of said placement, said identifying of said books that contain blocked items, said routing of said wires, said pausing of said routing, and said repositioning of said books until said routing of said wires is complete, to produce a finalized integrated circuit design; and
    outputting said modified integrated circuit design.

2. The method according to claim 1, further comprising, after said repositioning of said books, checking routing utilization of said wires.

3. The method according to claim 1, further comprising, before said outputting of said modified integrated circuit design, adding buffers, rerouting open nets, adding N-well books, and adding redundant vias.

4. A method of placing items and routing wiring pursuant to integrated circuit specifications, said method comprising:
    placing and positioning said items to create an integrated circuit design, wherein said integrated circuit design comprises books, wherein said books comprise a group of items previously positioned within a book area, and wherein said books are stored in integrated circuit design libraries and are generic to a plurality of different integrated circuit designs;
    legalizing placement of said items within said integrated circuit design by checking positions of said items against rules and moving items that violate said rules;
    identifying ones of said books in said integrated circuit design which contain blocked items that have pins blocked by wires;

if said books do not have said blocked items, routing wires between said items and said books and periodically checking whether said routing of said wires creates additional blocked items;

if said books do have said blocked items:

pausing said routing of said wires;

repositioning ones of said books that have said blocked items in a controlled process that limits movement of said books according to a signal output power of said books; and spreading out said books that have said blocked items by increasing said book area to a larger book area and spreading out said items within said larger book area, wherein said increasing of said book area comprises a controlled process that limits a size of said larger book area according to said signal output power of said books;

iteratively repeating said legalizing of said placement, said identifying of said books that contain blocked items, said routing of said wires, said pausing of said routing, said repositioning of said books, and said spreading out of said books, until said routing of said wires is complete, to produce a finalized integrated circuit design; and outputting said modified integrated circuit design.

5. The method according to claim 4, further comprising, after said repositioning of said books, checking routing utilization of said wires.

6. The method according to claim 4, further comprising, before said outputting of said modified integrated circuit design, adding buffers, rerouting open nets, adding N-well books, and adding redundant vias.

* * * * *